(12) United States Patent
Oda et al.

(10) Patent No.: US 8,269,908 B2
(45) Date of Patent: Sep. 18, 2012

(54) THIN-FILM TRANSISTOR, METHOD OF MANUFACTURING THE SAME, AND DISPLAY DEVICE

(75) Inventors: Koji Oda, Tokyo (JP); Naoki Nakagawa, Tokyo (JP); Takeshi Ono, Tokyo (JP); Yusuke Uchida, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 815 days.

(21) Appl. No.: 12/335,806

(22) Filed: Dec. 16, 2008

(65) Prior Publication Data

US 2009/0159884 A1    Jun. 25, 2009

(30) Foreign Application Priority Data

Dec. 19, 2007  (JP) .................................. 2007-327273

(51) Int. Cl.
   *G02F 1/136*  (2006.01)
(52) U.S. Cl. ............................................. 349/43; 349/52
(58) Field of Classification Search ........................ None
   See application file for complete search history.

(56) References Cited

U.S. PATENT DOCUMENTS 5,079,606 A * 1/1992 Yamamura et al. ............ 257/365
5,582,880 A   12/1996 Mochizuki et al.
5,719,065 A * 2/1998 Takemura et al. ............ 438/163
6,355,943 B1 * 3/2002 Sung ................................ 257/72

FOREIGN PATENT DOCUMENTS

| JP | 63-283134 | 11/1988 |
|----|-----------|---------|
| JP | 5-67782   | 3/1993  |
| JP | 5-275346  | 10/1993 |
| JP | 5-335335  | 12/1993 |
| JP | 6-349695  | 12/1994 |
| JP | 7-162001  | 6/1995  |
| JP | 8-254713  | 10/1996 |
| JP | 2007-138301 | 6/2007 |

* cited by examiner

*Primary Examiner* — Lucy Chien
(74) *Attorney, Agent, or Firm* — Oblon, Spivak, McClelland, Maier & Neustadt, L.L.P.

(57) ABSTRACT

A method of manufacturing a thin-film transistor according to an embodiment of the present invention includes the step of forming a gate insulator on a gate electrode. The gate insulator includes at least a first region being in contact with a hydrogenated amorphous silicon film, and a second region positioned below the first region. The first and second regions are deposited using a source gas including $NH_3$, $N_2$, and $SiH_4$, and $H_2$ gas or a mixture of $H_2$ and He. The first region is deposited by setting the flow-rate ratio $NH_3/SiH_4$ in a range from 11 to 14 and the second region is deposited by setting the flow-rate ratio $NH_3/SiH_4$ to be equal to or less than 4. It is thus possible to provide a thin-film transistor having excellent characteristics and high reliability, a method of manufacturing the same, and a display device including the thin-film transistor mounted thereon.

9 Claims, 7 Drawing Sheets

|  | FIRST REGION 11 | | SECOND REGION 12 | | THRESHOLD VOLTAGE Vth BIAS AFTER 30000 SECONDS | THRESHOLD SHIFT AMOUNT $\Delta V_{th}$ | ON-STATE CURRENT (A) |
| --- | --- | --- | --- | --- | --- | --- | --- |
|  | N/Si COMPOSITION RATIO | FILM THICKNESS | N/Si COMPOSITION RATIO | FILM THICKNESS | | | |
| EXAMPLE 1 | 1.3 | 10nm | 1.00 | 350nm | 3.2 | 1.8 | 7.02E-07 |
| EXAMPLE 2 | 1.3 | 30nm | 1.00 | 330nm | 3.1 | 1.7 | 7.10E-07 |
| EXAMPLE 3 | 1.5 | 10nm | 1.00 | 350nm | 3.1 | 1.85 | 6.90E-07 |
| EXAMPLE 4 | 1.5 | 30nm | 0.90 | 330nm | 3.1 | 1.7 | 7.14E-07 |
| EXAMPLE 5 | 1.5 | 30nm | 1.00 | 330nm | 3.1 | 1.6 | 7.02E-07 |
| EXAMPLE 6 | 1.32 | 50nm | 1.00 | 310nm | 3.8 | 1.63 | 6.00E-07 |
| EXAMPLE 7 | 1.5 | 50nm | 1.00 | 310nm | 4 | 1.5 | 5.50E-07 |
| COMPARATIVE EXAMPLE 1 | 0.93 | 360nm | — | — | 3.1 | 4.5 | 7.20E-07 |
| COMPARATIVE EXAMPLE 2 | 1.2 | 360nm | — | — | 4.4 | 2.8 | 5.20E-07 |
| COMPARATIVE EXAMPLE 3 | 1.5 | 360nm | — | — | 6.2 | 1.6 | 4.03E-07 |

Fig. 7

THIN-FILM TRANSISTOR, METHOD OF MANUFACTURING THE SAME, AND DISPLAY DEVICE

BACKGROUND OF THE INVENTION

1. Field of the Invention

The present invention relates to a thin-film transistor and a method of manufacturing the same. Further, the present invention relates to a display device including the thin-film transistor.

2. Description of Related Art

In recent years, active-matrix liquid crystal display devices have been produced in which a thin-film transistor (hereinafter, referred to also as "TFT") incorporating a hydrogenerated amorphous silicon film is used as a switching element. The hydrogenated amorphous silicon film has high process consistency with liquid crystal display devices mainly made of glass, in that the hydrogenated amorphous silicon film can be uniformly deposited on a large substrate at relatively low temperature (200° C. to 350° C.).

Examples of the structure of TFTs incorporating the hydrogenated amorphous silicon film include a staggered structure and a coplanar structure. In the staggered structure, a gate electrode and source/drain electrodes are relatively opposed to each other with the hydrogenated amorphous silicon film interposed therebetween. In the coplanar structure, the gate electrode and the source/drain electrodes are disposed on the same side with respect to the hydrogenated amorphous silicon film. Examples of the structure of the TFTs further include a top gate (forward staggered) type in which the gate electrode is positioned above the hydrogenated amorphous silicon film, and a bottom gate (inverted staggered) type in which the gate electrode is positioned below the hydrogenated amorphous silicon film.

The most popular structure of TFTs mounted on liquid crystal display devices is the inverted staggered structure capable of significantly reducing the effect of light irradiation due to a backlight. FIG. 9 shows a schematic cross-sectional view of a TFT of the inverted staggered type according to a related art example. Referring to FIG. 9, a TFT 100 of the inverted staggered type includes an insulating substrate 101, a gate electrode 102, a gate insulator 103, a hydrogenated amorphous silicon film 104, an n-type amorphous silicon film 105, a source electrode 106a, a drain electrode 106b, and a protective insulating film 107. The hydrogenated amorphous silicon film 104 and the n-type amorphous silicon film 105 are semiconductor layers.

First, a conductive film for forming the gate electrode is deposited on the insulating substrate 101 such as a glass substrate by a method such as vapor deposition. Then, the gate electrode 102 is formed into a desired formed through a photolithography process, an etching process, a resist removing process, and the like. Further, the gate insulator 103, the hydrogenated amorphous silicon film 104 and the n-type amorphous silicon film 105 are sequentially deposited on the gate electrode 102 and the insulating substrate 101. Then, the hydrogenated amorphous silicon film 104 and the n-type amorphous silicon film 105 are patterned into an island shape.

Next, a conductive film for forming source/drain electrodes is deposited to cover the gate insulator 103 and the semiconductor layers. Then, the source electrode 106a and the drain electrode 106b each having a desired shape are obtained through the photolithography process, the etching process, and the like. After that, a part of each of the n-type amorphous silicon film 105 and the hydrogenated amorphous silicon film 104 corresponding to a back channel portion of the TFT 100 is etched. Then, the protective insulating film 107 is formed to cover the whole surface, thereby completing the TFT functioning as a switching element.

Incidentally, the performance of TFTs is greatly affected by a defect level of an interface between an amorphous silicon film and a gate insulator. Thus, it is important to reduce the defect level in order to improve the TFT characteristics. The defect level is generated due to the morphology of the interface between the gate insulator and the amorphous silicon film, plasma damage caused during deposition, or the like.

As the gate insulator that forms the TFT, a silicon nitride film is used in many cases. As in the case of the hydrogenated amorphous silicon film, the silicon nitride film is often formed using a plasma chemical vapor deposition (CVD) method capable of performing low-temperature deposition. Thus, the defect level is likely to be generated at the interface between the silicon nitride film and the hydrogenated amorphous silicon film during the deposition process. The defect level causes an increase in threshold voltage of the TFT and a reduction in field-effect mobility. Further, when the TFT is driven for a long period of time, electrons are injected into the silicon nitride film through the defect level, which causes a problem of a threshold voltage shift. Furthermore, since the silicon nitride film itself has an electron trapping level, unless proper conditions are provided, there arises a problem in that the threshold voltage shift of the TFT is accelerated.

To reduce the defect level, a method of controlling deposition conditions for the gate insulator, or the surface state of the gate insulator has been proposed (see Japanese Unexamined Patent Application Publication No. 05-335335 and Japanese Unexamined Patent Application Publication No. 07-162001).

Japanese Unexamined Patent Application Publication No. 05-335335 proposes a method of carrying out hydrogen plasma treatment on the surface of the gate insulator after the formation of the gate insulator and before the formation of the semiconductor layers, as the method of reducing the generation of the interface state density, defects, or the like between the gate insulator and the hydrogenated amorphous silicon film. Specifically, $SiH_4$ (silane), $NH_3$ (ammonia), and $N_2$ (nitrogen), which are raw materials of the gate insulator, are introduced into a vacuum chamber, and the gate insulator is deposited to obtain a desired film thickness. Then, immediately before completion of deposition of the gate insulator (before reaching target film thickness), hydrogen is introduced into the vacuum chamber, and the supply of $SiH_4$, $NH_3$, and $N_2$ is stopped. Further, according to the method, very weak hydrogen plasma is continuously discharged to the surface of the gate insulator until the source gas ($NH_3$ and $N_2$) for the gate insulator, which is left in the vacuum chamber, does not affect the formation of the semiconductor layers.

In order to obtain a TFT achieving high field-effect mobility, Japanese Unexamined Patent Application Publication No. 07-162001 proposes a gate insulator of a two-layered structure including a first gate insulator formed of a silicon nitride film, which is formed on a gate electrode and which contains a small amount of hydrogen, and a second gate insulator formed of a silicon nitride film which is formed on the first gate insulator and which contains a large amount of hydrogen. Those gate insulators are formed by plasma CVD method using a source gas including $N_2$, $SiH_4$, and $NH_3$. Japanese Unexamined Patent Application Publication No. 07-162001 discloses that a flow-rate ratio between $NH_3$ and $SiH_4$ ($NH_3/SiH_4$) of the first gate insulator containing a small amount of hydrogen is set to be equal to or less than 4, and a flow-rate ratio between $NH_3$ and $SiH_4$ ($NH_3/SiH_4$) of the second gate insulator containing a large amount of hydrogen is set to be equal to or greater than 4.

According to the method disclosed in Japanese Unexamined Patent Application Publication No. 05-335335, the surfaces of the gate insulators are held in a chemically active state, thereby reducing the generation of the interface state density and defects. However, this effect is temporary. When the TFT is driven for a long period of time, for example, for 30000 seconds or longer, a satisfactory effect is not obtained and the threshold voltage shift is large, which results in low reliability of the TFT. Further, when the hydrogen plasma treatment is carried out excessively, there arises a problem in that the adhesion between the gate insulator and the hydrogenated amorphous silicon film deteriorates and peeling between the hydrogenated amorphous semiconductor film 104 and the gate insulator 103 occurs during the manufacturing process.

Particularly in recent years, liquid crystal display devices are widely applied to industrial equipment, and an ambient temperature thereof widely ranges from −20° C. to 80° C. In a high-temperature environment, the threshold voltage shift is accelerated, with the result that the reliability of the TFT operation is more likely to deteriorate. Thus, there is a demand for highly reliable TFTs.

According to the method disclosed in Japanese Unexamined Patent Application Publication No. 07-162001, the flow-rate ratio between $NH_3$ and $SiH_4$ ($NH_3/SiH_4$) of the second gate insulator, which is in contact with the semiconductor layer, is set to be equal to or greater than 4, as described above. As a result of repeated experiments, however, the inventors of the present invention have found that the internal stress of the silicon nitride film changes from a compressive stress to a tensile stress as the flow-rate ratio between $NH_3$ and $SiH_4$ ($NH_3/SiH_4$) is increased, and that the internal stress departs from a generally preferable range of 100 to 500 MPa.

The stress of the hydrogenerated amorphous silicon, which is deposited under appropriate conditions, turns into a compressive stress in a range from about 200 to 600 MPa. When the stress of the silicon nitride film turns into the tensile stress, the warping direction of each layer is reversed, which causes defects. Thus, there is a fear that the field-effect mobility of the TFT deteriorates and the threshold voltage increases. Further, a dielectric constant of the silicon nitride film having the tensile stress is significantly reduced. Accordingly, in order to keep the capacitance of the silicon nitride film constant, the thickness of the silicon nitride film needs to be reduced, which causes a reduction in yield.

Furthermore, along with the recent increase in size of display devices, the area of a glass substrate is increased in size to square meters, and a warping amount of the entire substrate tends to significantly increase. In particular, in the periphery of the substrate, peeling is more likely to occur at the interface between the silicon nitride film and the amorphous silicon film. Accordingly, it is extremely important to keep the stress balance between layers.

SUMMARY OF THE INVENTION

The present invention has been made in view of the above-mentioned circumstances, and therefore an object of the present invention is to provide a thin-film transistor having excellent characteristics and high reliability, a method of manufacturing the same, and a display device including the thin-film transistor mounted thereon.

A method of manufacturing a thin-film transistor according to an aspect of the present invention includes the steps of: forming a gate electrode on a substrate; forming a gate insulator on the gate electrode; and forming a hydrogenated amorphous silicon film immediately above the gate insulator. The gate insulator includes at least a first region being in contact with the hydrogenated amorphous silicon film, and a second region positioned below the first region. The first region and the second region are deposited using a source gas including $NH_3$, $N_2$, and $SiH_4$, and $H_2$ gas or a mixed gas of $H_2$ gas and He gas. The first region is deposited at a flow-rate ratio between $NH_3$ and $SiH_4$ ($NH_3/SiH_4$) in a range from 11 to 14. The second region is deposited at a flow-rate ratio between $NH_3$ and $SiH_4$ ($NH_3/SiH_4$) of 4 or less.

A thin-film transistor according to another aspect of the present invention includes: a gate electrode formed on a substrate; a gate insulator formed on the gate electrode; and a hydrogenated amorphous silicon film formed immediately above the gate insulator. The gate insulator includes at least a first region being in contact with the hydrogenated amorphous silicon film, and a second region positioned below the first region. The first region and the second region are each formed of a silicon nitride film. A composition ratio between nitrogen and silicon (N/Si) of the silicon nitride film of the first region is set in a range from 1.3 to 1.5. A composition ratio between nitrogen and silicon (N/Si) of the silicon nitride film of the second region is set to be equal to or less than 1.0.

The present invention has an advantageous effect of providing a thin-film transistor having excellent characteristics and high reliability, a method of manufacturing the same, and a display device including the thin-film transistor mounted thereon.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

FIG. 7 is a table showing measured values of TFTs according to examples and comparative examples;

DESCRIPTION OF THE PREFERRED EMBODIMENTS

Hereinafter, exemplary embodiments of the present invention of the present invention will be described. It should be noted that other embodiments are also within the scope of the present invention as long as there is no deviation from the gist of the present invention. Further, the sizes and ratios of components shown in the attached drawings are selected for ease of explanation, and the sizes and ratios thereof are not limited thereto.

First Exemplary Embodiment

Figure 1:
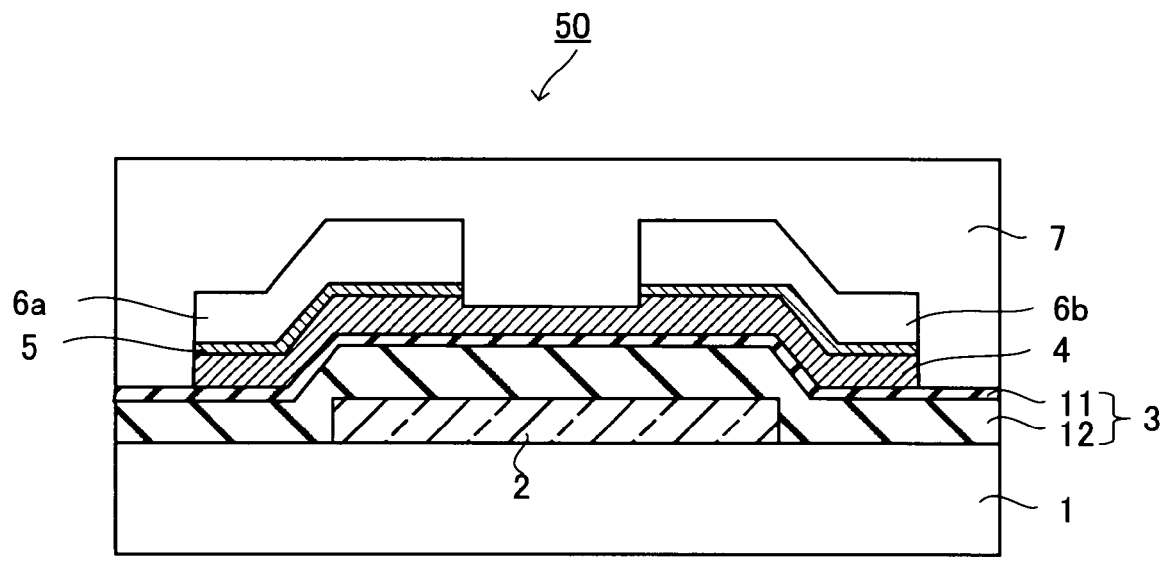
FIG. 1 is a schematic cross-sectional view of a TFT according to a first exemplary embodiment of the present invention.

FIG. 1 shows a schematic cross-sectional view of the structure of a TFT 50 according to a first exemplary embodiment of the present invention. The TFT 50 is an inverted staggered type TFT and is produced by channel etch (CE).

Referring to FIG. 1, the TFT 50 includes an insulating substrate 1, a gate electrode 2, a gate insulator 3, a hydrogenated amorphous silicon film 4, an n-type amorphous silicon film 5, a source electrode 6a, a drain electrode 6b, and a protective insulating film 7. The hydrogenated amorphous silicon film 4 and the n-type amorphous silicon film 5 are semiconductor layers.

As the insulating substrate 1, a substrate with permeability, such as a glass substrate or a quartz substrate, is used. The gate electrode 2 is formed on the insulating substrate 1. The gate insulator 3 is formed on the gate electrode 2 to cover the gate electrode 2. The hydrogenated amorphous silicon film 4 is formed immediately above the gate insulator 3. At least a part of the hydrogenated amorphous silicon film 4 is disposed opposite to the gate electrode 2 with the gate insulator 3 interposed therebetween.

The n-type amorphous silicon film 5 is formed on the hydrogenated amorphous silicon film 4. The n-type amorphous silicon film 5 has a function of electrically connecting the hydrogenated amorphous silicon film 4 to the source/drain electrodes. The hydrogenated amorphous silicon film 4 is a pure semiconductor to which impurities are not added, that is, a so-called intrinsic semiconductor. As the n-type amorphous silicon film 5, an n-type semiconductor film such as an $n^+$a-Si ($n^+$ amorphous silicon) film obtained by doping a small amount of phosphorous (P) into a-Si is used.

The source electrode 6a and the drain electrode 6b are formed on the n-type amorphous silicon film 5. The protective insulating film 7 is formed to cover a channel region, the source electrode 6a, and the drain electrode 6b (see FIG. 1). As the protective insulating film 7, $SiN_x$, $SiO_y$, and the like, or a mixture and a stacked layer thereof can be used.

The source electrode 6a and the drain electrode 6b are disposed opposite to at least a part of the gate electrode 2 with the gate insulator 3, the hydrogenated amorphous silicon film 4, and the n-type amorphous silicon film 5 interposed therebetween. In other words, to function as a TFT, a thin-film transistor region is present on the gate electrode 2, thereby being more susceptible to an electric field obtained when a voltage is applied to the gate electrode.

In the case where a voltage is applied between the source electrode 6a and the drain electrode 6b, if the voltage applied to the gate electrode 2 exceeds a given threshold, a channel is formed between the source and the drain of the hydrogenated amorphous silicon film 4, and a current flow through the channel. In short, the TFT 50 functions as a switching element.

When the TFT 50 is mounted on a liquid crystal display device, a contact hole is formed in the protective insulating film 7, and in addition, a pixel electrode is formed. The drain electrode 6b and the pixel electrode are connected to each other through the TFT 50 to supply a potential for driving a liquid crystal, thereby making it possible to display a desired image.

The gate insulator 3 according to the first exemplary embodiment of the present invention is formed of a silicon nitride film. Note that the silicon nitride film is divided into two regions in a film thickness direction, and the two regions are formed of silicon nitride films having different compositions. A region of the gate insulator 3, which is in contact with the hydrogenated amorphous silicon film 4, is defined as a first region 11, and a region of the gate insulator 3, which is positioned below the first region 11, is defined as a second region 12.

A composition ratio between nitrogen and silicon (N/Si) of the silicon nitride which forms the first region 11 of the gate insulator 3 is set in a range from 1.3 to 1.5. Further, a composition ratio between nitrogen and silicon (N/Si) of the silicon nitride which forms the second region 12 of the gate insulator 3 is preferably set to be equal to or less than 1.0. The reason for this is described later.

A stress value of each of the films corresponding to the first region 11 and the second region 12 is 500 MPa or smaller when the films are individually formed, and a stress thereof is obtained in a compressive stress direction when the films are individually formed.

The total thickness of the first region 11 and the second region 12, that is, the thickness of the gate insulator 3 is desirably in a range from 300 nm to 400 nm. When the thickness is smaller than 300 nm, there is a fear that the dielectric strength decreases due to foreign matters mixed in during the deposition, which leads to a reduction in yield. Further, when the thickness exceeds 400 nm, the capacitance of the gate insulator decreases, and an ON-state current of the TFT decreases. Thus, there is a fear that the desired characteristics cannot be obtained. The film thickness of the first region 11 is preferably set to be equal to or smaller than 30 nm. This is because, when the film thickness of the first region 11 exceeds 30 nm, hydrogen supplied from the second region 12 is not sufficiently supplied to an interface between the first region 11 and the hydrogenated amorphous silicon film 4. Further, from the viewpoint of enhancing the reliability of the TFT, it is preferable to set the film thickness of the first region 11 be set to be equal to or greater than 10 nm.

The use of the gate insulator 3 having the structure described above makes it possible to provide a thin-film transistor having excellent characteristics and high reliability. The reason for this is described below.

Figure 10:
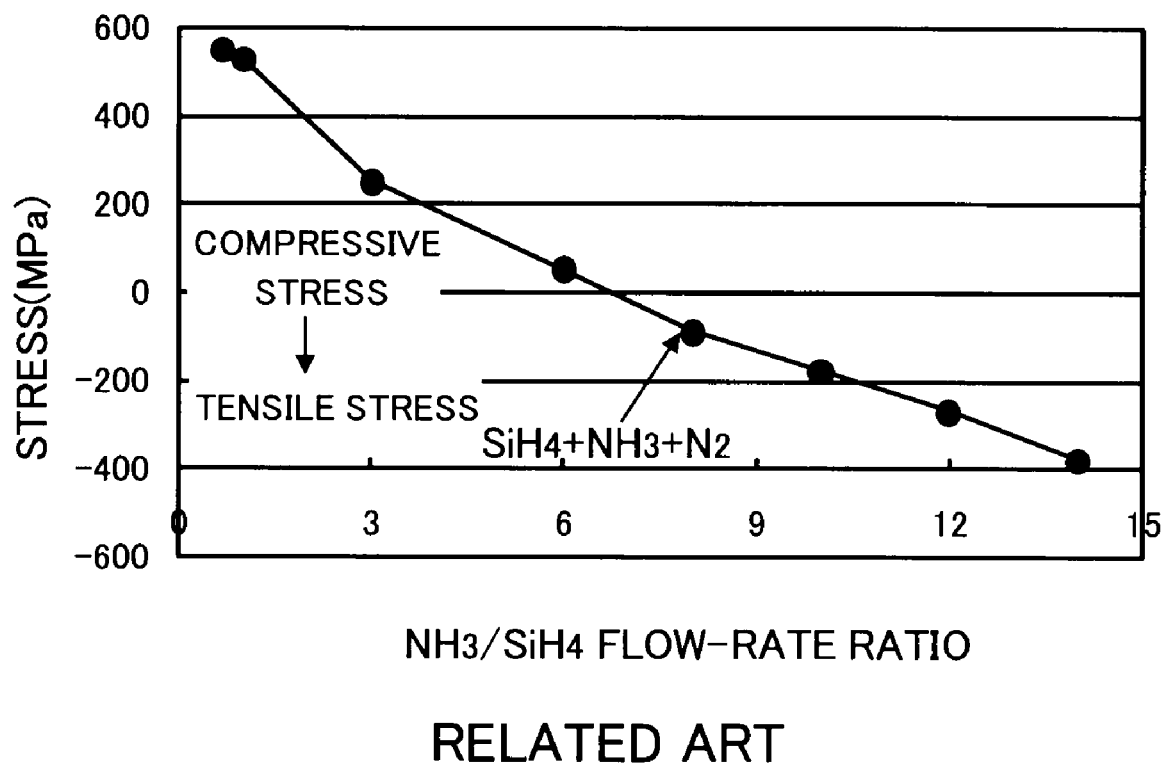
FIG. 10 is a graph in which stress values of a silicon nitride film are plotted against a flow-rate ratio of $NH_3/SiH_4$.

As described in the related art example, the silicon nitride which forms the gate insulator can be obtained by depositing films by plasma CVD method using gases $NH_3$, $SiH_4$, and $N_2$ (hereinafter, referred to also as "source gas"). FIG. 10 shows a graph in which stress values of the silicon nitride film are plotted in the case where the flow rate of $N_2$ is kept constant and the silicon nitride film is deposited by varying the flow-rate ratio between $NH_3$ and $SiH_4$. As apparent from FIG. 10, the stress value varies greatly as the flow-rate ratio between $NH_3$ and $SiH_4$ ($NH_3/SiH_4$) increases. Particularly when the flow-rate ratio between $NH_3$ and $SiH_4$ ($NH_3/SiH_4$) exceeds 6, the compressive stress turns into a tensile stress. That is, the warping direction is reversed.

In general, a satisfactory insulating film deposited by plasma CVD method has a compressive stress. When the compressive stress turns into a tensile stress, the film quality becomes sparse. When the film quality becomes sparse, a reduction in dielectric strength, a reduction in dielectric constant, and a reduction in mechanical strength occur. The reduction in dielectric strength and the reduction in mechanical strength cause a reduction in yield, and the reduction in dielectric constant causes a reduction in ON-state current of the TFT.

Figure 2:
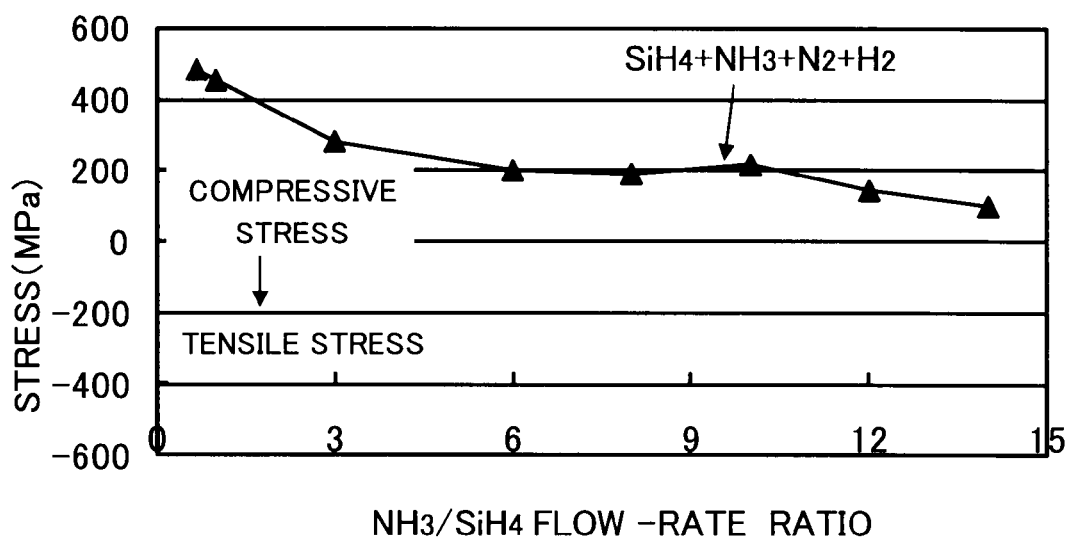
FIG. 2 is a graph in which stress values of a silicon nitride film are plotted against a flow-rate ratio of $NH_3/SiH_4$.
Figure 9:
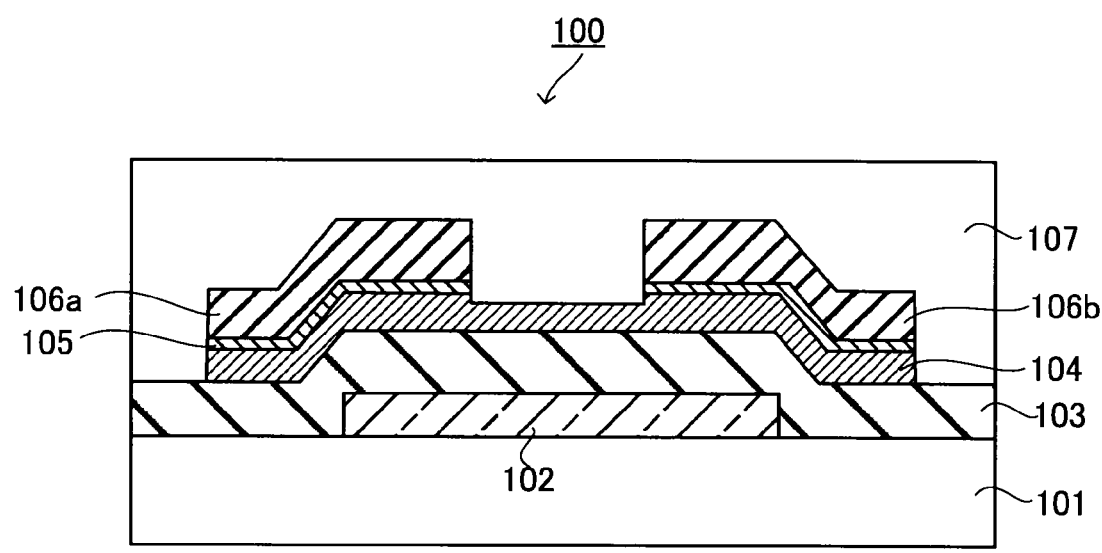
FIG. 9 is a schematic cross-sectional view showing a TFT according to a related art.

As a result of a repeated study to solve the problem of tensile stress, the inventors of the present invention have found that the problem can be solved by adding $H_2$ gas in addition to the source gas including $NH_3$, $SiH_4$, and $N_2$. FIG. 2 shows a graph in which stress values of the silicon nitride film are plotted in the case where the flow rate of each of $N_2$ and $H_2$ gases is kept constant and the silicon nitride film is deposited by varying the flow-rate ratio between $NH_3$ and $SiH_4$ ($NH_3/SiH_4$). The experimental conditions are the same as FIG. 9 except that the $H_2$ gas is added. FIG. 2 shows the example in which the $H_2$ gas which is about 40% of the total flow rate is added. As apparent from FIG. 2, the compressive stress can be maintained even when the flow-rate ratio $NH_3/SiH_4$ is increased. Further, it has been confirmed that, when the flow-rate ratio $NH_3/SiH_4$ is increased, the deposited silicon nitride film excellent in quality is obtained. It is considered that the addition of the $H_2$ gas has no adverse affect on the characteristics of TFTs, since the silicon nitride which forms the gate insulator 3 contains a certain amount of hydrogen.

It has been confirmed that the same effects can be obtained not only when the $H_2$ gas is added alone, but also when a mixture of $H_2$ gas and He gas is used as the source gas to be added. It is considered that the addition of the He gas has no adverse effect on the characteristics of TFTs, since the He gas is an inert gas. In addition, it turned out that, even when $H_2$ or He is added, the amount of reduction in deposition rate is small and deterioration in uniformity of the film thickness does not occur. In other words, the $H_2$ gas or the mixed gas of $H_2$ and He functions as a gas for obtaining the stress of the silicon nitride film in the compressive stress direction.

The ratio of the $H_2$ gas or the mixed gas of $H_2$ and He to the total flow rate is preferably set in a range from 30% to 50%. When the ratio is less than 30%, the effect of a stress variation is not sufficiently exhibited in some cases. This is because the number of Si—H bonds decreases when the ratio exceeds 50%.

Note that, in the process of deposition by plasma CVD method, not only the flow rate of gas, but also a gas pressure and an RF power used at the time of deposition, for example, can be used as deposition parameters. The film quality can be varied by adjusting the deposition parameters. However, it is difficult to meet the characteristics required for the TFT by adjusting the deposition parameters. For example, while it is possible to change the stress of the film to be obtained into the compressive stress by reducing the gas pressure at the time of deposition, the uniformity of the film deteriorates and a reduction in yield occurs. Further, the deposition rate decreases and a deterioration in performance occurs. Furthermore, while it is possible to change the stress of the film to be obtained into the compressive stress by increasing the RF power obtained at the time of deposition, the plasma damage increases at the same time, which increases the defect density of the film. As a result, the deterioration in performance of the TFT inevitably occurs.

Figure 3:
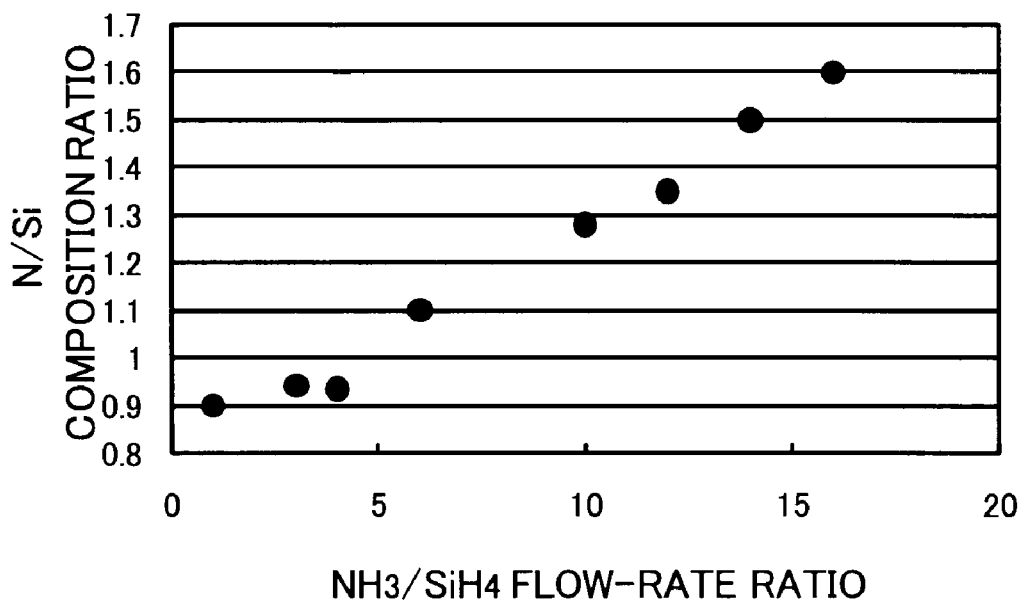
FIG. 3 is a graph in which a composition ratio (N/Si) of a silicon nitride film is plotted against a flow-rate ratio of $NH_3/SiH_4$.

FIG. 3 is a graph in which the composition ratio between nitrogen and silicon (N/Si) of the silicon nitride film to be formed is plotted against the flow-rate ratio between $NH_3$ and $SiH_4$ ($NH_3/SiH_4$) used when the silicon nitride film is deposited. An XPS (ESCA5400 manufactured by ULVAC-PHI. Inc.) was used for the measurement. The flow-rate ratio of each of the $H_2$ gas and the $N_2$ gas is kept constant. As apparent from FIG. 3, when the flow-rate ratio between $NH_3$ and $SiH_4$ ($NH_3/SiH_4$) increases, the composition ratio (N/Si) increases. This indicates that the concentration of nitrogen contained in the silicon nitride film increases.

Figure 4:
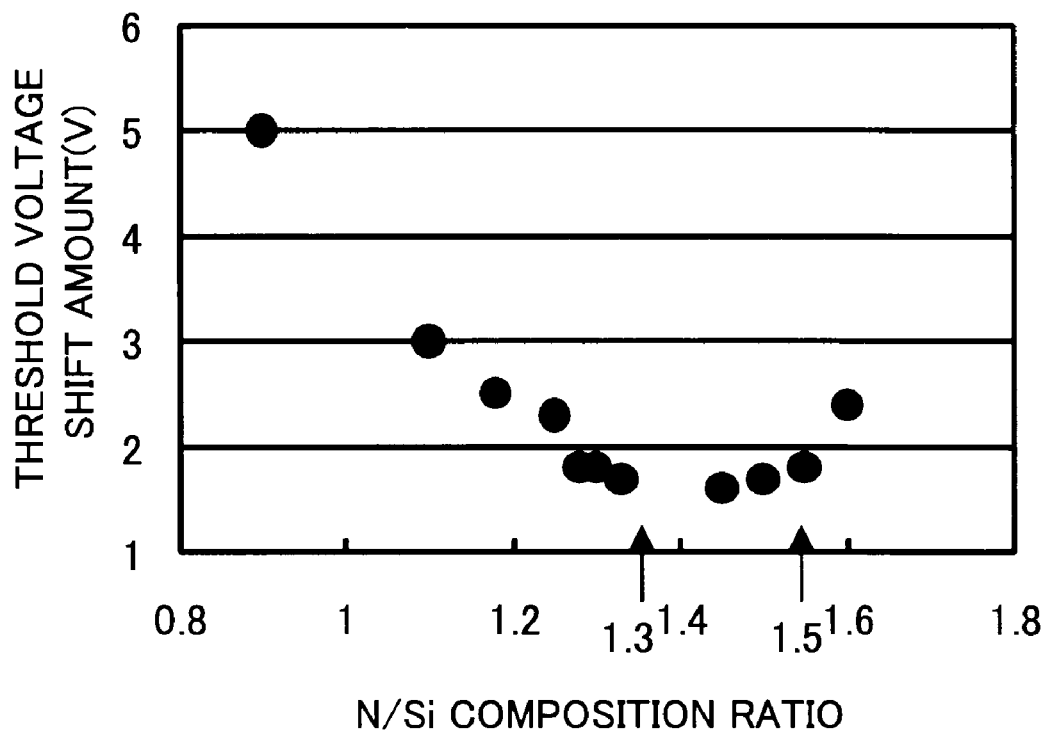
FIG. 4 is a graph in which a threshold voltage shift amount is plotted against a composition ratio (N/Si) of a silicon nitride film.

Further, a study was made on the relation between the composition ratio (N/Si) of the silicon nitride film, which forms the gate insulator, and a threshold voltage shift amount. Specifically, multiple inverted staggered type TFTs were produced by varying the composition ratio (N/Si) of the silicon nitride film which forms the gate insulator. Then, a stress voltage of 30 V was applied to the gate electrode of each of the TFTs for 30000 seconds, and the threshold voltage shift amount obtained after the application was studied. FIG. 4 is a graph in which the threshold voltage shift amount obtained after the voltage is continuously applied for 30000 seconds is plotted against the composition ratio (N/Si) of the silicon nitride film. As apparent from FIG. 4, the threshold voltage shift amount decreases as a whole, as the composition ratio (N/Si) increases. This indicates that a variation in characteristics obtained when the TFT is driven for a long period of time can be suppressed when the composition ratio (N/Si) is high, which makes it possible to provide a highly reliable TFT.

It turned out that, when the threshold voltage shift amount is calculated on a time axis, the reliability of the transistor can be improved up to ten times as much as that of the conventional transistor by setting the composition ratio (N/Si) to be equal to or greater than 1.3. As apparent from FIG. 4, when the composition ratio (N/Si) exceeds 1.5, however, the threshold voltage shift amount increases again. This is because, if the silicon nitride film contains an excess amount of nitrogen, the adhesion between the silicon nitride film and the amorphous silicon film decreases, and peeling occurs at the interface between the gate insulator and the hydrogenated amorphous semiconductor film. Accordingly, when the composition ratio (N/Si) of the silicon nitride forming the gate insulator is in the range from 1.3 to 1.5, it is possible to provide a TFT having excellent characteristics and high reliability.

Figure 5:
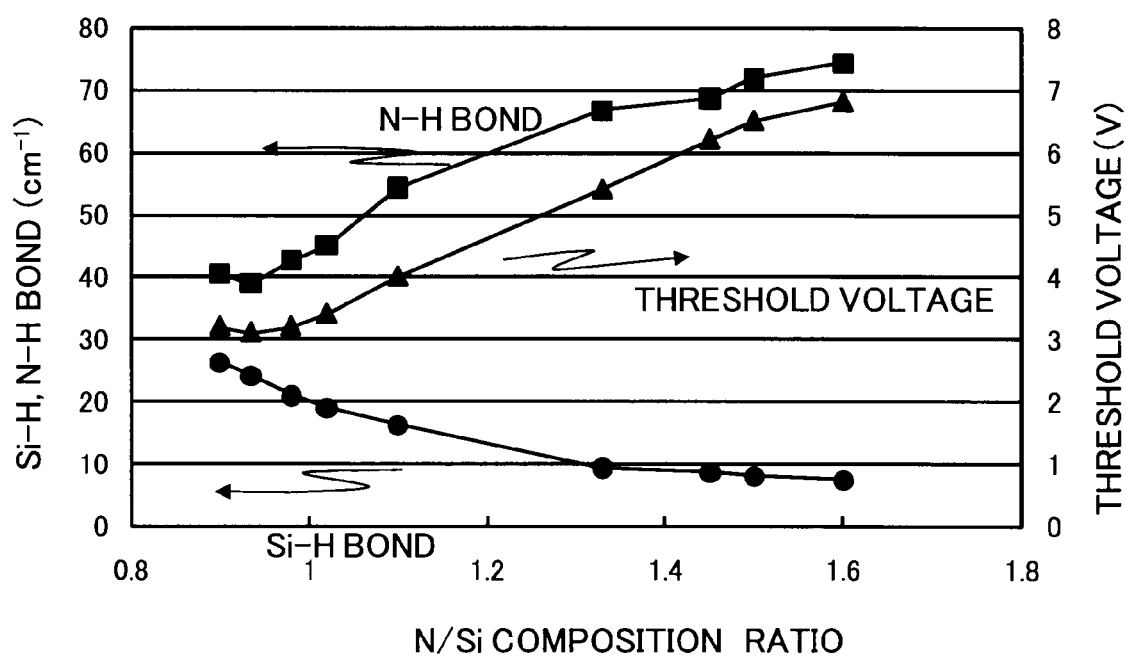
FIG. 5 is a graph in which Si—H bonds, N—H bonds, and a threshold voltage are plotted against a composition ratio (N/Si) of a silicon nitride film.

FIG. 5 shows a graph in which Si—H bonds ($cm^{-1}$) and N—H bonds ($cm^{-1}$) of the silicon nitride film to be formed are plotted against the composition ratio (N/Si) of the silicon nitride which forms the gate insulator. Further, TFTs in which silicon nitride films are formed as gate insulators at each composition ratio (N/Si) of the corresponding silicon nitride film are produced, and FIG. 5 shows a graph in which threshold voltage values (V) of the TFTs are plotted. The measurement of the Si—H bonds ($cm^{-1}$) and the N—H bonds ($cm^{-1}$) is carried out by Fourier transform infrared (FTIR) absorption.

FIG. 5 shows that, when the number of Si—H bonds contained in the silicon nitride film decreases, the threshold voltage increases, which deteriorates response characteristics of the TFT. The deterioration in response characteristics of the TFT occurs even if the stress is maintained in the compressive stress direction. As apparent from FIG. 5, the Si—H bond is correlated to the composition ratio (N/Si).

When the composition ratio (N/Si) of the silicon nitride film is in the range from 1.3 to 1.5, the threshold voltage shift amount falls within the optimum range, whereas the threshold voltage value (initial value) is set to about 5 to 6. The threshold voltage of a general thin-film transistor is about 2.5 to 4 V. When the initial threshold voltage is high, the turn-on characteristics of the transistor deteriorate. In other words, when the composition ratio (N/Si) is increased, the threshold voltage increases, which deteriorates the turn-on characteristics of the transistor.

FIG. 5 shows that the composition ratio (N/Si) of the silicon nitride film is preferably set lower in terms of the threshold voltage. When the composition ratio (N/Si) of the silicon nitride film is set to be equal to or less than 1, the threshold voltage is about 3 V, and excellent turn-on characteristics can be obtained. The amount of Si—H bonds obtained when the composition ratio (N/Si) of the silicon nitride film is set to be equal to or less than 1 is about 20 to 30 cm$^{-1}$ (see FIG. 5). That is, as the composition ratio (N/Si) of the silicon nitride film decreases, the number of Si—H bonds increases, and the threshold voltage drops. According to the FTIR measurement, the concentration of hydrogen contained in the silicon nitride film involves Si—H bonds and N—H bonds. However, since the bond energy of the Si—H bonds is smaller than that of the N—H bonds, hydrogen that allows termination of a dangling bond in the interface state density can be easily obtained, as the number of Si—H bonds increases.

To obtain excellent characteristics of the TFT, it is desirable to use a silicon nitride film containing a large number of Si—H bonds. Containing a large amount of Si—H bonds means that a large amount of hydrogen which allows termination of a defect of the interface between the gate insulator 3 and the hydrogenated amorphous silicon film 4 is contained. On the other hand, in order to enhance the reliability of the TFT, it is desirable to increase the concentration of nitrogen contained in the silicon nitride film. That is, it is desirable to increase the content of the Si—H bonds while increasing the concentration of nitrogen contained in the silicon nitride film. In fact, however, the concentration of nitrogen contained in the silicon nitride film and the amount of Si—H bonds are in a trade-off relation, and it is difficult to satisfy both at the same time.

As a result of a repeated study to obtain a TFT having excellent characteristics and high reliability, the inventors of the present invention have found that it is preferable to form the first region 11 and the second region 12 of the gate insulator 3 in the following manner. That is, the composition ratio (N/Si) of the silicon nitride film of the first region 11 is set in the range from 1.3 to 1.5, and the composition ratio (N/Si) of the silicon nitride film of the second region 12 is set to be equal to or less than 1.0. Further, in each of the silicon nitride films that form the first region 11 and the second region 12 of the gate insulator 3, the stress is obtained in the compressive stress direction, and the stress value of each of the films is set to be equal to or smaller than 500 MPa.

The first region 11 forming the gate insulator 3 enables enhancement of the reliability of the TFT, and the second region 12 enables provision of excellent characteristics of the TFT. The hydrogen contained in the second region 12 is supplied to the interface between the hydrogenated amorphous silicon film and the first region 11, thereby providing the TFT having excellent characteristics. Though the reliability of the TFT is not dependent on the film thickness of the first region 11, when the thickness is extremely large, the supply of hydrogen diffused from the second region 12 becomes insufficient. For this reason, the first region 11 with small thickness is preferably used. As a result of a repeated study on the film thickness of the first region 11, the inventors of the present invention have found that it is preferable to set the film thickness to be equal to or smaller than 30 nm. Further, from the viewpoint of securing the sufficient reliability of the TFT by suppressing the threshold voltage shift, it is preferable to set the film thickness to be equal to or greater than 10 nm.

Figure 6A:
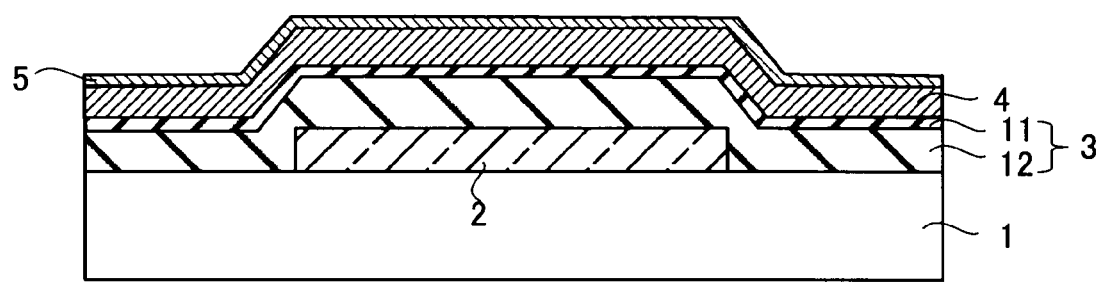
FIGS. 6A to 6C are cross-sectional views each showing a step of manufacturing the TFT according to the first exemplary embodiment of the present invention.

Next, a description is given of a method of manufacturing the TFT 50 having the above-mentioned structure, with reference to FIG. 6.

First, a conductive film is deposited on the insulating substrate 1 by DC magnetron sputtering or the like. A Cr target was used as a target, and a conductive film having a thickness of 400 nm was deposited at an argon (Ar) gas flow rate of 100 sccm, at a pressure of 0.14 Pa, at a power of 1.0 kw, and at a temperature of 200° C. As long as electrical conductivity that satisfies the device characteristics is obtained, the film thickness can be changed depending on metals or the like to be used. As the meals to be used, Al, Ti, an alloy mainly containing those metals, or a stacked film of those metals may be used instead of Cr.

Note that, when the surface morphology of the first region 11 of the gate insulator 3 deteriorates, the threshold voltage, the turn-on characteristics, and the field-effect mobility deteriorate. Since the surface morphology of the silicon nitride film is dependent on the surface state of the lower layer, it is necessary to optimize the conditions as well as processes for the gate electrode 2. Thus, the surface average roughness (Ra) of the gate electrode 2 needs to be set to a level at which the field-effect mobility is not significantly reduced. According to the first exemplary embodiment of the present invention, when the surface average roughness (Ra) of the gate electrode was measured by the AFM, the surface average roughness was 2.3 nm.

After the conductive film for forming the gate electrode 2 is deposited, resist made of photosensitive resin is coated on the conductive film by spin coating. Then, the coated resist is exposed to light from above a photomask, thereby exposing the resist to light. Next, the resist subjected to exposure is developed to pattern the resist. After that, the exposed conductive film is etched, and the resist pattern is removed. As a result, the conductive film is formed into a pattern with a desired shape, thereby forming the gate electrode, a gate signal line (not shown), and the like.

Next, the gate insulator 3 is deposited on the gate electrode 2 and the insulating substrate 1 by plasma CVD method.

The second region 12 of the gate insulator 3 is deposited with a film thickness in a range from 340 to 380 nm at a deposition temperature of 280° C., at a high-frequency power density of 0.1 to 0.3 W/cm$^2$, at a pressure of 80 to 130 Pa, at a flow-rate ratio NH$_3$/SiH$_4$ of 1 to 4 using a mixed gas of deposition gases N$_2$, SiH$_4$, NH$_3$, and H$_2$, and at an H$_2$ flow rate of 30 to 40% of the total flow rate.

As described above, the first region 11 and the second region 12 are sequentially deposited without opening to the atmosphere. The first region 11 is deposited with a film thickness in a range from 10 to 30 nm at a deposition temperature of 280° C., at a high-frequency power density of 0.1 to 0.3 W/cm$^2$, at a pressure of 80 to 130 Pa, at a flow-rate ratio NH$_3$/SiH$_4$ of 11 to 14 using a mixed gas of deposition gases N$_2$, SiH$_4$, NH$_3$, and H$_2$, and at an H$_2$ flow rate of 30 to 40% of the total flow rate.

By the above-mentioned manufacturing method, the composition ratio between nitrogen and silicon (N/Si) of the second region 12 is set in a range from 0.9 to 1.0, and the Si—H bond strength obtained by the RTIR is in a range from 20 to 30 cm$^{-1}$, thereby obtaining a film capable of supplying a sufficient amount of hydrogen. Further, the composition ratio between nitrogen and silicon (N/Si) of the first region 11 is in a range from 1.3 to 1.5.

Next, the hydrogenated amorphous silicon film 4 functioning as a semiconductor layer is sequentially deposited on the first region 11 without opening to the atmosphere. The hydrogenated amorphous silicon film 4 is deposited with a thickness in a range from 130 to 200 nm at a deposition temperature of 280° C., at a pressure of 150 to 300 Pa, at a high-frequency power of 0.02 to 0.06 W/cm$^2$, and at a flow-rate ratio H$_2$/SiH$_4$ of 3 to 5. For example, the hydrogenated amorphous silicon film 4 having a thickness of 150 nm is formed. After that, the n-type amorphous silicon film 4, into which phosphorous is doped, is sequentially deposited with a thickness in a range from 20 to 50 nm (see FIG. 6A).

Figure 6B:
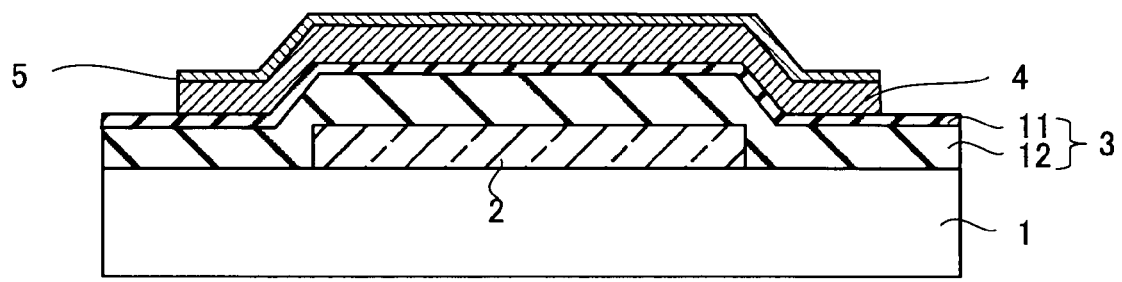
Figure 6C:
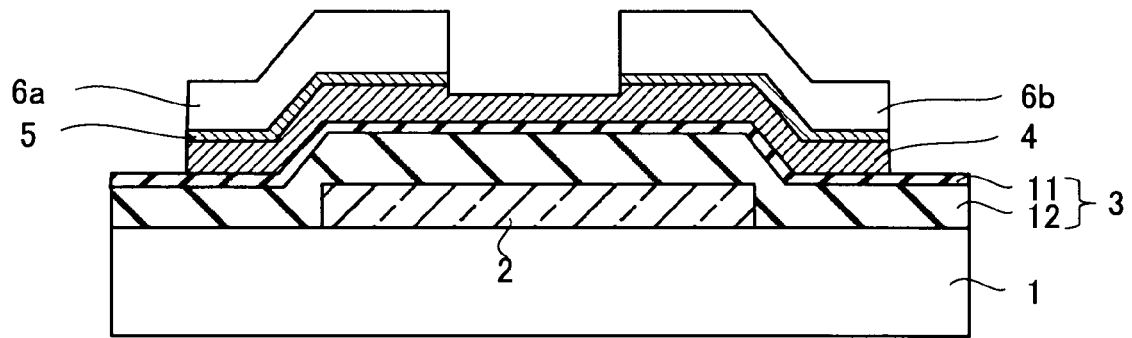

Next, referring to FIG. 6B, the hydrogenated amorphous silicon film 4 and the n-type amorphous silicon film 5 are formed into an island pattern with a desired shape through the photolithography process and the etching process.

Then, a conductive film for forming the source electrode 6a and the drain electrode 6b is deposited. As the conductive film, Cr, Al, Mo, an alloy mainly containing those metals, or a stacked film of those metals may be used. After that, the conductive film is subjected to the photolithography process, the etching process, and the like, thereby obtaining the source electrode 6a and the drain electrode 6b with the desired shape. Then, a part of each of the exposed n-type amorphous silicon film 5 and the hydrogenated amorphous silicon film 4 positioned below the n-type amorphous silicon film 5 is removed by etching. As a result, the back channel is formed (see FIG. 6C).

According to the first exemplary embodiment of the present invention, a Cr film and an Al—Si—Cu film were deposited as the source electrode 6a and the drain electrode 6b, respectively, by DC magnetron sputtering method. The Cr film was deposited with a thickness of 50 nm under the following spattering conditions. That is, the Cr film was deposited at an Ar gas flow rate of 100 sccm, at a pressure is 0.14 Pa, at a DC power of 1.0 kw, and at a temperature of 200° C. The Al—Si—Cu film was deposited with a thickness of 300 nm at an Ar gas flow rate of 100 sccm, at a pressure of 0.14 Pa, at a DC power of 1.0 kw, and at a temperature of 80° C.

Then, the protective insulating film 7 is formed by plasma CVD method so as to cover the gate insulator 3, the channel region 3a, source electrode 6a, and the drain electrode 6b. The protective insulating film 7 was deposited with a thickness of 300 nm at a deposition temperature of 280° C., at a high-frequency power density of 0.1 to 0.3 $W/cm^2$, and at a pressure of 80 to 130 Pa, by using a mixed gas of deposition gases $N_2$, $SiH_4$, and $NH_3$.

After that, to alleviate the plasma damages generated during the production process, heat treatment was carried out for 30 to 60 minutes at a temperature of 250 to 300° C. Also during the heat treatment, hydrogen is supplied from the second region 12 of the gate insulator 3 to the interface between the first region 11 and the hydrogenated amorphous silicon film 4, thereby reducing defects.

FIG. 7 shows the study results on the characteristics and reliability of TFTs (Examples 1 to 7) produced as the TFT according to the first exemplary embodiment of the present invention, by varying the deposition conditions for the first region 11 and the second region 12. FIG. 7 also shows the study results on the characteristics and reliability of TFTs (Comparative Examples 1 to 3) each having a gate insulator deposited under deposition conditions departing from the conditions of the first exemplary embodiment of the present invention. According to the present invention, as apparent from the table shown in FIG. 7, the gate insulator 3 including the first region 11 for securing the reliability and the second region 12 for securing the excellent characteristics is provided, thereby obtaining a TFT having excellent characteristics and high reliability.

The TFT 50 according to the first exemplary embodiment of the present invention can be mounted as, for example, a TFT array substrate for display devices such as a flat panel display including a liquid crystal display device and an EL display device.

According to the first exemplary embodiment of the present invention, when the gate insulator 3 is deposited, $H_2$ gas or a mixture of $H_2$ gas and He gas is added besides the material gas, thereby obtaining the stress of the gate insulator to be deposited, in the compressive stress direction. As a result, the defect level of the interface between the hydrogenated amorphous silicon film and the gate insulator can be reduced. Further, the use of the gate insulator 3 including the first region 11 and the second region 12 having the above-mentioned structure enables the obtainment of excellent turn-on characteristics of the TFT. Furthermore, the threshold voltage of the TFT can be lowered. As a result, it is possible to provide a TFT having excellent characteristics. Moreover, it is possible to manufacture an excellent TFT in which the amount of the shift of the threshold voltage caused by driving the TFT for a long period of time is reduced. Hence, it is possible to provide a highly reliable TFT.

Note that the first exemplary embodiment of the present invention has described the example in which the gate insulator 3 is formed of a silicon nitride film divided into two regions in the film thickness direction, but the present invention is not limited thereto. As long as the first region 11 being in contact with the hydrogenated amorphous silicon film 4, and the second region 12 positioned below the first region 11 are provided, various modifications can be made without departing from the gist of the present invention. For example, a silicon nitride film with a composition other than the first region 11 and the second region 12 may be provided. Alternatively, a film other than the silicon nitride film may be provided.

Further, the regions (first region and second region) are not necessarily formed of a film having a single composition. For example, as long as the composition ratio between nitrogen and silicon (N/Si) of the silicon nitride film of the first region 11 falls within the range from 1.3 to 1.5, distribution may be generated in the film thickness direction. In the first region 11 and the second region 12, the composition ratio between nitrogen and silicon (N/Si) of the silicon nitride film may be gradually changed toward the film thickness direction, or may be simply changed to obtain the above-mentioned values. Though the inverted staggered structure has been described above, the present invention is not limited thereto. The effects of the present invention can be obtained also in the forward staggered type or the coplanar structure.

Second Exemplary Embodiment

Next, an example of a TFT having a structure different from that of the first exemplary embodiment will be described. Note that, in the following description, the same components as those of the above exemplary embodiment are denoted by the same reference numerals, and a description thereof is omitted as appropriate.

The basic structure of a TFT 51 according to a second exemplary embodiment of the present invention and a manufacturing method therefor are similar to those of the first exemplary embodiment of the present invention except for the following points. That is, the TFT 50 according to the first exemplary embodiment of the present invention includes the gate insulator 3 divided into two regions (first region 11 and second region 12) in the film thickness direction, whereas the TFT 51 according to the second exemplary embodiment of the present invention includes a gate insulator 3a divided into three regions (first region 11, second region 12, and third region 13) in the film thickness direction. In addition, the gate insulator 3 according to the first exemplary embodiment of the present invention is formed of the silicon nitride film, whereas the gate insulator 3a according to the second exemplary embodiment of the present invention is formed of a silicon nitride film and an oxide film mainly made of tetraethyl orthosilicate (TEOS) (hereinafter, referred to as "TEOS oxide film").

Figure 8:
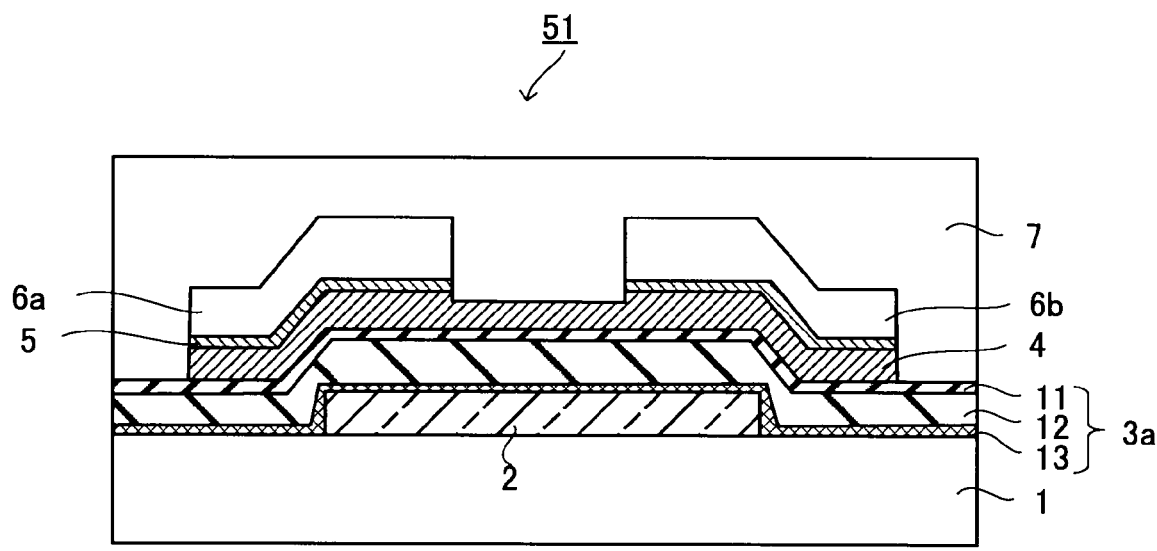
FIG. 8 is a schematic cross-sectional view showing a TFT according to a second exemplary embodiment of the present invention.

FIG. 8 shows a schematic cross-sectional view of a cut portion of the TFT 51 according to the second exemplary embodiment of the present invention. Referring to FIG. 8, the gate insulator 3a is divided into three regions, that is, the first region 11 being in contact with the hydrogenated amorphous silicon film 4, the second region 12 positioned below the first region 11, and the third region 13 formed immediately above the gate electrode.

In the first region 11 of the gate insulator 3a, the composition ratio between nitrogen and silicon (N/Si) of the silicon nitride film is set in the range from 1.3 to 1.5 in the same manner as in the first exemplary embodiment of the present invention. Further, the composition ratio between nitrogen and silicon (N/Si) of the silicon nitride which forms the second region 12 of the gate insulator 3a is set to be equal to or less than 1.0. Furthermore, the third region 13 of the gate insulator 3a is formed of the TEOS oxide film.

A total thickness of the first region 11, the second region 12, and the third region 13, that is, the thickness of the gate insulator 3a is desirably set in a range from 300 nm to 400 nm. When the film thickness is smaller than 300 nm, there is a fear that the dielectric strength is reduced due to foreign matters mixed in during the deposition, which leads to a reduction in yield. Further, when the film thickness exceeds 400 nm, the capacitance of the gate insulator is reduced, which raises a fear that the ON-state current of the TFT is reduced and the desired characteristics cannot be obtained. The first region 11 preferably has a film thickness of 30 nm or smaller. This is because, when the film thickness of the first region 11 exceeds 30 nm, hydrogen supplied from the second region 12 is not sufficiently supplied to the interface between the first region 11 and the hydrogenated amorphous silicon film 4. Further, in order to sufficiently suppress the threshold voltage shift, the film thickness of the first region 11 is desirably set to be equal to or greater than 10 nm.

It is preferable to set the film thickness of the third region 13 in a range from 25 nm to 100 nm. When the film thickness is set to be equal to or greater than 25 nm, the effect of the unevenness of the gate electrode 2 can be sufficiently reduced. Further, when the film thickens is set to be equal to or smaller than 100 nm, it is possible to secure the sufficient capacitance of the gate insulator, which prevents a reduction in ON-state current of the TFT.

As described above, the morphology of the interface between the gate insulator and the hydrogenated amorphous silicon film is an important factor for determining the characteristics of the TFT. One of factors that affect the morphology of the interface is the surface morphology of the gate insulator. The morphology is also affected by the gate electrode as described below.

In general, metals such as Al, Cr, Mo, Ta, and Ni are used as the materials of the gate electrode 2. Other metals can be used as the materials of the electrode, as long as the metals have a specific resistance in a range from 5 to 50 $\mu\Omega\cdot$cm. The gate electrode 2 is deposited using the metal materials described above by DC magnetron sputtering method, with an Ar gas used as a sputter gas. According to the DC magnetron sputtering, an attack of a recoil argon gas onto the deposition surface occurs, which causes a problem in that the morphology of the electrode surface deteriorates. Further, depending on the metal materials, crystal growth easily occurs. In the case of using a metal material in which crystal growth easily occurs, the surface morphology is dependent on the film thickness, and when the thickness is increased, the morphology of the electrode surface deteriorates. Along with this, the surface unevenness becomes larger.

In the case of depositing the gate insulator on the extremely uneven surface of the gate electrode 2, the silicon nitride film is deposited along the uneven shape of the electrode surface. As a result, the surface unevenness of the gate insulator becomes much larger.

As the surface unevenness on the gate insulator becomes larger, the defect density of the interface between the gate insulator and the hydrogenated amorphous silicon film increases, which leads to a deterioration in field-effect mobility and an increase in threshold voltage. As a result of a repeated study to solve such a problem, the inventors of the present invention have found that the surface morphology can be improved by disposing the TEOS oxide film in the third region 13, which leads to the improvement in characteristics of the transistor.

The TEOS oxide film was deposited by plasma CVD method using TEOS and $O_2$ as material gases. The TEOS decomposed by a plasma reaches the substrate surface, and is then changed into SiOx by dehydrating condensation reaction. Compared with the insulting film mainly made of $SiH_4$, the TEOS gas has mobility at the substrate surface, thereby making it possible to obtain an excellent coverage and smooth the surface unevenness of the gate electrode. Further, since the TEOS oxide film contains a large amount of hydrogen in the film, the TEOS oxide film can be used as a supply source for supplying hydrogen to the interface between the gate insulator 3 and the hydrogenated amorphous silicon film 4.

Next, a description is given of a method of manufacturing the TFT 51 having the above-mentioned structure. First, a conductive film is deposited on the insulating substrate 1 by DC magnetron sputtering or the like. An Al alloy target was used as a target, and the conductive film was deposited with a thickness of 400 nm at an Ar gas flow rate of 100 sccm, at a pressure of 0.14 Pa, at a power of 1.0 kw, and at a temperature of 100° C. As long as the electrical conductivity that satisfies the device characteristics is obtained, the film thickness can be changed depending on metals or the like to be used. The Cr film used in the first exemplary embodiment of the present invention and the like may be used.

When the average roughness (Ra) of the electrode surface obtained when an Al alloy is deposited by sputtering with a thickness of 400 nm was measured by the AFM, the average roughness was about 6.0 nm. Further, the maximum step Rmax was in a range from 18 to 22 nm.

After the gate electrode 2 is formed into the desired shape, the TEOS oxide film was deposited by plasma CVD method with TEOS and $O_2$ used as material gases. The third region 13 of the gate insulator 3 is deposited with a film thickness of 50 nm at a deposition temperature of 280 to 350° C., at a high-frequency power density of 0.3 to 0.9 W/cm², at a pressure of 150 to 200 Pa, at a TEOS gas flow rate of 100 to 150 sccm, and at an $O_2$ gas flow rate of 4000 to 6000 sccm.

Next, the second region 12 and the first region 11 of the silicon nitride film are sequentially deposited without opening to the atmosphere. The second region 12 of the gate insulator 3a was deposited with a film thickness in a range from 250 to 330 nm at a deposition temperature of 280° C., at a high-frequency power density of 0.1 to 0.3 W/cm², at a pressure of 80 to 130 Pa, at a flow-rate ratio $NH_3/SiH_4$ of 1 to 4 using material gases of $N_2$, $SiH_4$, and $NH_3$, and $H_2$ gas, and at an $H_2$ flow rate of 30 to 40% of the total flow rate.

The first region 11 of the gate insulator 3a is deposited with a film thickness in a range from 10 to 30 nm at a deposition temperature of 280° C., at a high-frequency power density of 0.1 to 0.3 W/cm², at a pressure of 80 to 130 Pa, at a flow-rate ratio $NH_3/SiH_4$ of 11 to 14 using material gases of $N_2$, $SiH_4$, and $NH_3$, and $H_2$ gas, and at an $H_2$ flow rate of 30 to 40% of the total flow rate. The subsequent manufacturing method is the same as that described in the first exemplary embodiment of the present invention.

The TFT obtained by the above-mentioned manufacturing method has a threshold voltage of 3.0 V, an ON-state current of $7.3 \times 10^{-7}$ A, a threshold voltage shift amount (increased amount) of 1.7 V, which is obtained after a bias of 30 V is applied to the gate electrode for 30000 seconds. Thus, the TFT having excellent characteristics and high reliability is obtained.

According to the second exemplary embodiment of the present invention, the third region 13 formed of the TEOS oxide film is formed in the gate insulator 3a, thereby improving the surface evenness of the gate insulator to be equal to or smaller than Ra 3 nm. Further, the TEOS oxide which forms the third region 13 and the silicon nitride which forms the second region 12 serve as supply sources for supplying hydrogen to the interface between the gate insulator 3a and the hydrogenated amorphous silicon film 4, thereby enabling a reduction in threshold voltage. Moreover, the composition ratio between nitrogen and silicon (N/Si) of the silicon nitride film that forms the first region 11 of the gate insulator 3a being in contact with the hydrogenated amorphous silicon film 4 is set in the range from 1.3 to 1.5, thereby making it possible to provide an excellent transistor in which the amount of the shift of the threshold voltage caused by driving the TFT for a long period of time is small.

Note that the second exemplary embodiment of the present invention has described the example in which the gate insulator 3 is divided into three regions in the film thickness direction, the TEOS oxide film is formed immediately above the gate electrode, and the silicon nitride film is formed in the region disposed above the TEOS oxide film, but the present invention can be modified in various manners without departing from the gist of the present invention. For example, though the second exemplary embodiment of the present invention has described the example in which the TEOS oxide film is disposed in the region (third region 13) immediately above the gate electrode, the present invention is not limited thereto. For instance, the TEOS oxide film may be disposed between the first region 11 and the second region 12 each formed of a silicon nitride film.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A thin-film transistor, comprising:
    a gate electrode formed on a substrate;
    a gate insulator formed on the gate electrode; and
    a hydrogenated amorphous silicon film formed immediately above the gate insulator, wherein:
    the gate insulator comprises at least a first region being in contact with the hydrogenated amorphous silicon film, and a second region positioned below the first region;
    the first region and the second region are each formed of a silicon nitride film, wherein there are no other silicon nitride films disposed below the second region within the gate insulator;
    a composition ratio between nitrogen and silicon (N/Si) of the silicon nitride film of the first region is set in a range from 1.3 to 1.5; and
    a composition ratio between nitrogen and silicon (N/Si) of the silicon nitride film of the second region is set to be equal to or less than 1.0.

2. The thin-film transistor according to claim 1, wherein the first region has a film thickness in a range from 10 nm to 30 nm.

3. The thin-film transistor according to claim 1, wherein the gate insulator further comprises a third region positioned below the first region, a main layer of the third region being formed of an oxide film mainly made of tetraethoxysilane.

4. The thin-film transistor according to claim 2, wherein the gate insulator further comprises a third region positioned below the first region, a main layer of the third region being formed of an oxide film mainly made of tetraethoxysilane.

5. The thin-film transistor according to claim 3, wherein the third region has a thickness in a range from 25 nm to 100 nm.

6. The thin-film transistor according to claim 4, wherein the third region has a thickness in a range from 25 nm to 100 nm.

7. The thin-film transistor according to claim 1, wherein the gate insulator has a thickness in a range from 300 nm to 400 nm.

8. A display device, comprising a thin-film transistor, the thin-film transistor comprising:
    a gate electrode formed on a substrate;
    a gate insulator formed on the gate electrode; and
    a hydrogenated amorphous silicon film formed immediately above the gate insulator, wherein:
    the gate insulator comprises at least a first region being in contact with the hydrogenated amorphous silicon film, and a second region positioned below the first region;
    the first region and the second region are each formed of a silicon nitride film, wherein there are no other silicon nitride films disposed below the second region within the gate insulator;
    a composition ratio between nitrogen and silicon (N/Si) of the silicon nitride film of the first region is set in a range from 1.3 to 1.5; and
    a composition ratio between nitrogen and silicon (N/Si) of the silicon nitride film of the second region is set to be equal to or less than 1.0.

9. The thin-film transistor according to claim 1, wherein the second region is in contact with the gate electrode.

* * * * *